(12) United States Patent
Tamai et al.

(10) Patent No.: US 12,087,655 B2
(45) Date of Patent: Sep. 10, 2024

(54) SEMICONDUCTOR APPARATUS AND VEHICLE

(71) Applicant: FUJI ELECTRIC CO., LTD., Kawasaki (JP)

(72) Inventors: Yuta Tamai, Matsumoto (JP); Hiromichi Gohara, Matsumoto (JP); Takafumi Yamada, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 438 days.

(21) Appl. No.: 17/645,994

(22) Filed: Dec. 26, 2021

(65) Prior Publication Data

US 2022/0122899 A1 Apr. 21, 2022

Related U.S. Application Data

(63) Continuation of application No. PCT/JP2020/043753, filed on Nov. 25, 2020.

(30) Foreign Application Priority Data

Jan. 10, 2020 (JP) .................. 2020-003125

(51) Int. Cl.
*H01L 23/367* (2006.01)
*H01L 23/538* (2006.01)
*H01L 25/10* (2006.01)

(52) U.S. Cl.
CPC ........ *H01L 23/367* (2013.01); *H01L 23/5383* (2013.01); *H01L 23/5386* (2013.01); *H01L 25/105* (2013.01)

(58) Field of Classification Search
CPC ............... H01L 23/367; H01L 23/5383; H01L 23/5386; H01L 23/562; H01L 23/3735;
(Continued)

(56) References Cited

U.S. PATENT DOCUMENTS 10,141,271 B1 * 11/2018 Xu .................. H01L 21/485
2013/0277800 A1 10/2013 Hori
(Continued)

FOREIGN PATENT DOCUMENTS

JP  H08274423 A  10/1996
JP  H0982844 A  3/1997
(Continued)

OTHER PUBLICATIONS

International Search Report and (ISA/237) Written Opinion of the International Search Authority for International Patent Application No. PCT/JP2020/043753, mailed by the Japan Patent Office on Feb. 16, 2021.

*Primary Examiner* — Kyoung Lee
*Assistant Examiner* — Christina A Sylvia

(57) ABSTRACT

A semiconductor apparatus includes first and second semiconductor chips, and a circuit board. The circuit board is a laminated board sequentially including an insulating plate, a circuit layer, and a metal layer. The circuit layer includes a first mounting portion on which the first semiconductor chip is installed, a second mounting portion on which the second semiconductor chip is installed, and a first and second upper surface slit provided between the first and second mounting portion and extending in a first direction. The metal layer includes a first lower surface slit extending in the first direction. In a plan view, the first mounting portion, the first upper surface slit, the second upper surface slit, and the second mounting portion are provided side by side in the second direction. The first lower surface slit is located within a range defined by the first and second upper surface slit.

20 Claims, 12 Drawing Sheets

(58) Field of Classification Search
CPC ............. H01L 23/3672; H01L 23/3736; H01L 23/49838; H01L 25/105; H01L 25/072; H01L 25/18; H01L 24/29; H01L 24/32; H01L 24/40; H01L 24/45; H01L 24/48; H01L 24/49; H01L 24/83; H01L 2224/06181; H01L 2224/291; H01L 2224/32225; H01L 2224/40227; H01L 2224/45014; H01L 2224/48227; H01L 2224/4903; H01L 2224/73265; H01L 2224/83815; H01L 2924/00014; H01L 2924/10253; H01L 2924/10272; H01L 2924/1033; H01L 2924/13055; H01L 2924/13091; H01L 2924/30107; H01L 2924/3511; H01L 2924/3512; C04B 2237/343; C04B 2237/366; C04B 2237/368; C04B 2237/402; C04B 2237/407; C04B 37/021; C04B 37/026
See application file for complete search history.

(56) References Cited

U.S. PATENT DOCUMENTS

| | | |
|---|---|---|
| 2015/0223339 A1 | 8/2015 | Nakamura |
| 2016/0095213 A1 | 3/2016 | Otsubo |
| 2016/0233146 A1 | 8/2016 | Nakamura |
| 2016/0336255 A1 | 11/2016 | Miyawaki |
| 2017/0271236 A1 | 9/2017 | Uezato |
| 2017/0271274 A1 | 9/2017 | Hinata |
| 2017/0317008 A1 | 11/2017 | Momose |
| 2020/0176354 A1* | 6/2020 | Matsuzawa ....... H01L 23/49575 |
| 2021/0013141 A1* | 1/2021 | Nakayama ............. H01L 23/46 |
| 2021/0057324 A1* | 2/2021 | Leng .................. H01L 23/4334 |
| 2022/0301957 A1* | 9/2022 | Takano ................... C04B 37/02 |

FOREIGN PATENT DOCUMENTS

| | | |
|---|---|---|
| JP | H10154774 A | 6/1998 |
| JP | 2000124585 A | 4/2000 |
| JP | 2002344094 A | 11/2002 |
| JP | 2003017627 A | 1/2003 |
| JP | 2006344770 A | 12/2006 |
| JP | 2008085360 A | 4/2008 |
| JP | 2011035219 A | 2/2011 |
| JP | 2013102112 A | 5/2013 |
| JP | 2013222950 A | 10/2013 |
| JP | 2014120728 A | 6/2014 |
| JP | 2016072281 A | 5/2016 |
| JP | 2016096188 A | 5/2016 |
| JP | 2016122831 A | 7/2016 |
| JP | 2016154258 A | 8/2016 |
| JP | 2016219461 A | 12/2016 |
| JP | 2017069275 A | 4/2017 |
| JP | 2017168745 A | 9/2017 |
| JP | 2017174837 A | 9/2017 |
| JP | 2017199813 A | 11/2017 |
| JP | 6341822 B2 | 6/2018 |
| WO | 2014061211 A1 | 4/2014 |
| WO | 2015151235 A1 | 10/2015 |

* cited by examiner

200

SEMICONDUCTOR APPARATUS AND VEHICLE

The contents of the following Japanese patent application(s) are incorporated herein by reference:
NO. 2020-003125 filed in JP on Jan. 10, 2020
NO. PCT/JP2020/043753 filed in WO on Nov. 25, 2020

BACKGROUND

1. Technical Field

The present invention relates to a semiconductor apparatus and a vehicle.

2. Related Art

Conventionally, a semiconductor module including a semiconductor apparatus including a plurality of semiconductor devices such as a power semiconductor chip on which a cooling apparatus is installed is known (see, for example, Patent Literatures 1 to 6).

CITATION LIST

Patent Literature

Patent Literature 1: Japanese Patent Application Publication No. 2006-344770
Patent Literature 2: Japanese Patent Application Publication No. 2003-017627
Patent Literature 3: Japanese Patent Application Publication No. 2016-096188
Patent Literature 4: Japanese Patent Application Publication No. 2016-072281
Patent Literature 5: Japanese Patent Application Publication No. 08-274423
Patent Literature 6: Japanese Patent Application Publication No. 09-082844

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention.

Figure 1:
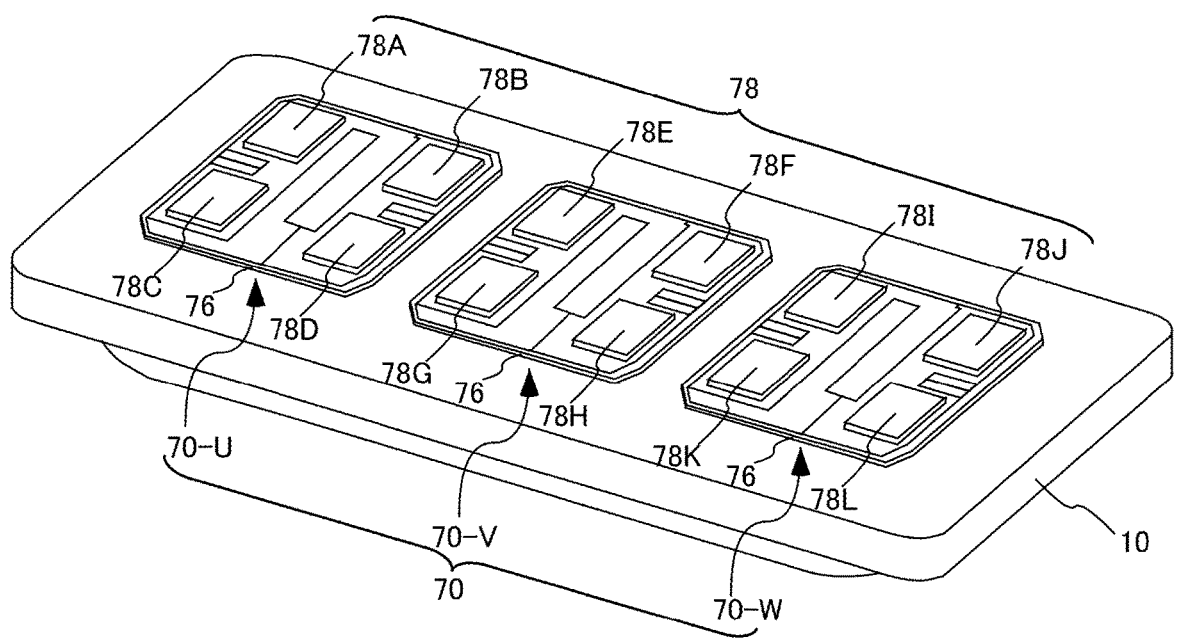
FIG. 1 is a schematic perspective view illustrating an example of a semiconductor module 100 according to an embodiment of the present invention.
Figure 1:
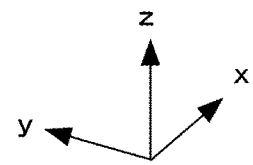

FIG. 1 is a schematic perspective view illustrating an example of a semiconductor module 100 according to an embodiment of the present invention. The semiconductor module 100 includes a semiconductor apparatus 70 and a cooling apparatus 10. The semiconductor apparatus 70 of the present embodiment is placed on the cooling apparatus 10. In the description of the present embodiment, a plane of the cooling apparatus 10 on which the semiconductor apparatus 70 is placed is an xy plane, and an axis perpendicular to the xy plane is a z axis. The xyz axes form a right-handed system. In the description of the present embodiment, a direction from the cooling apparatus 10 toward the semiconductor apparatus 70 in the z axis direction is referred to as upward, and the opposite direction is referred to as downward, but the upward and downward directions are not limited to the gravity direction. In the description of the present embodiment, among the surfaces of each member, a surface on the upper side is referred to as an upper surface, a surface on the lower side is referred to as a lower surface, and a surface between the upper surface and the lower surface is referred to as a side surface. In the description of the present embodiment, a plan view means a case where the semiconductor module 100 is viewed from the positive direction of the z axis.

The semiconductor apparatus 70 of the present embodiment includes three circuit boards 76, and four semiconductor chips 78 are mounted on each circuit board 76. In other words, the semiconductor apparatus 70 includes at least one circuit board 76 and two semiconductor chips 78 (for example, a first semiconductor chip 78A and a second semiconductor chip 78B) mounted on said circuit board 76. As illustrated in FIG. 1, the semiconductor apparatus 70 of the present embodiment is a power semiconductor apparatus, and includes a U-phase unit 70-U including the circuit board 76 and four semiconductor chips 78, a V-phase unit 70-V including the circuit board 76 and four semiconductor chips 78, and a W-phase unit 70-W including the circuit board 76 and four semiconductor chips 78. The semiconductor module 100 of the present embodiment functions as an apparatus constituting a three-phase AC inverter.

In the present embodiment, the U-phase unit 70-U includes a first semiconductor chip 78A, a second semiconductor chip 78B, a third semiconductor chip 78C, and a fourth semiconductor chip 78D. In addition, the V-phase unit 70-V includes a first semiconductor chip 78E, a second semiconductor chip 78F, a third semiconductor chip 78G, and a fourth semiconductor chip 78H. In addition, the W-phase unit 70-W includes a first semiconductor chip 78I, a second semiconductor chip 78J, a third semiconductor chip 78K, and a fourth semiconductor chip 78L. Note that each of the semiconductor chips 78 of the U-phase unit 70-U, the V-phase unit 70-V, and the W-phase unit 70-W serves as a heat source that generates heat in a case where the semiconductor module 100 operates.

The semiconductor chip 78 is a vertical semiconductor device and has an upper surface electrode and a lower surface electrode. As an example, the semiconductor chip 78 includes devices such as an insulated gate bipolar transistor (IGBT), a MOS field effect transistor (MOSFET), and a freewheeling diode (FWD) formed on a semiconductor substrate such as silicon. The semiconductor chip 78 may be a reverse conducting IGBT (RC-IGBT) in which an IGBT and an FWD are formed on one semiconductor substrate. In the RC-IGBT, the IGBT and the FWD may be connected in anti-parallel.

The lower surface electrode of the semiconductor chip 78 is connected to the upper surface of the circuit board 76. The upper surface electrode of the semiconductor chip 78 may be an emitter, a source, or an anode electrode, and the lower surface electrode may be a collector, a drain, or a cathode electrode. The semiconductor substrate in the semiconductor chip 78 may be silicon carbide (SiC) or gallium nitride (GaN).

The semiconductor chip 78 including a switching device such as an IGBT or a MOSFET has a control electrode. The semiconductor module 100 may have a control terminal connected to the control electrode of the semiconductor chip 78. The switching device can be controlled by an external control circuit via the control terminal.

The circuit board 76 may be, for example, a direct copper bonding (DCB) board or an active metal brazing (AMB) board.

The cooling apparatus 10 is formed of metal as an example, and is formed of metal including aluminum as a more specific example. The cooling apparatus 10 may be formed of a metal containing copper in addition to a metal containing aluminum. A plating layer such as nickel may be formed on the surface of the cooling apparatus 10. The cooling apparatus 10 may be a base plate on which the circuit board 76 is mounted. The cooling apparatus 10 may be a base plate provided with fins, or a combination of a jacket that accommodates fins and a base plate. Heat generated in each semiconductor chip 78 is transferred to the cooling apparatus 10.

Figure 2A:
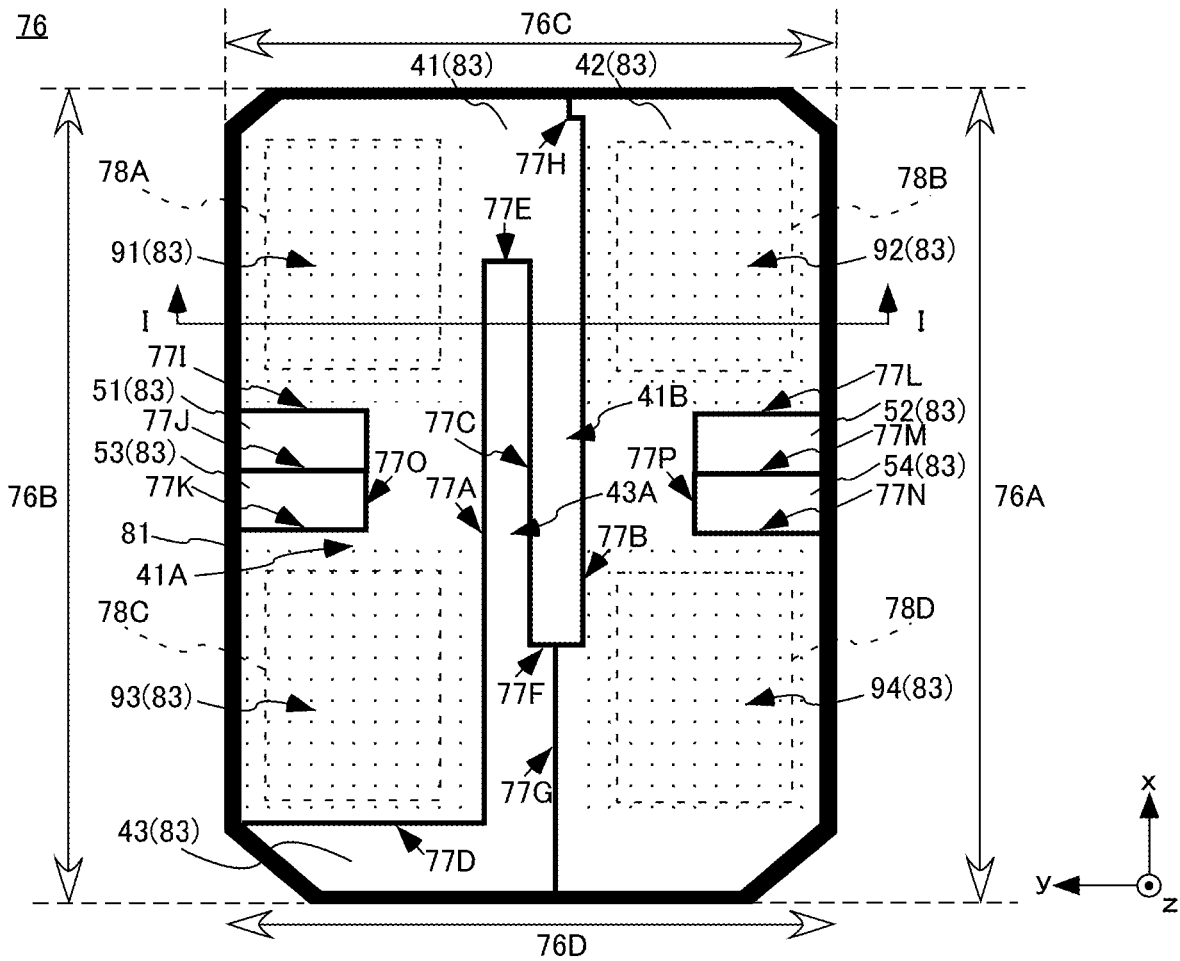
FIG. 2A is a plan view illustrating an example of a circuit board 76 of the semiconductor module 100 according to an embodiment of the present invention.
Figure 2B:
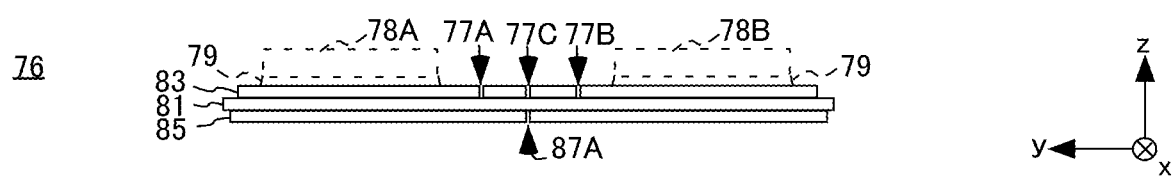
FIG. 2B is a sectional view illustrating an example of a circuit board 76 of the semiconductor module 100 according to an embodiment of the present invention.
Figure 2C:
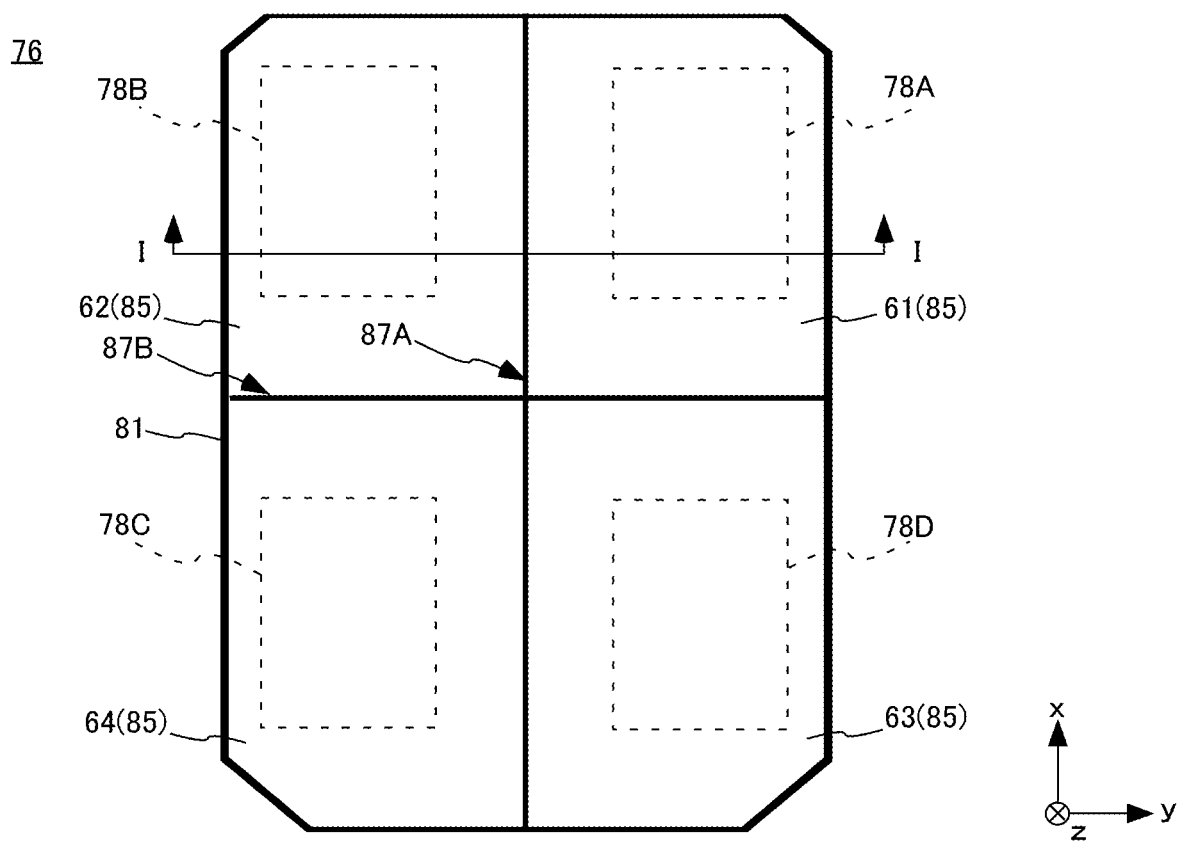
FIG. 2C is a bottom view illustrating an example of a circuit board 76 of the semiconductor module 100 according to an embodiment of the present invention.

FIG. 2A is a plan view illustrating an example of the circuit board 76 of the semiconductor module 100 according to an embodiment of the present invention. FIG. 2B is a sectional view illustrating an example of the circuit board 76 of the semiconductor module 100 according to an embodiment of the present invention. FIG. 2C is a bottom view illustrating an example of the circuit board 76 of the semiconductor module 100 according to an embodiment of the present invention. FIG. 2B illustrates a state in which the circuit board 76 is virtually cut along the yz plane along line I-I illustrated in FIG. 2A. In FIG. 2A to FIG. 2C, the first semiconductor chip 78A, the second semiconductor chip 78B, the third semiconductor chip 78C, and the fourth semiconductor chip 78D of the U-phase unit 70-U illustrated in FIG. 1 are indicated by broken lines. Note that the circuit board 76 is illustrated with the same dimensions in FIG. 2A to FIG. 2C.

Note that, in the following description, only the configuration of the U-phase unit 70-U as a representative of the U-phase unit 70-U to the W-phase unit 70-W may be described. The V-phase unit 70-V and the W-phase unit 70-W may have the same configuration as the U-phase unit 70-U, or some configurations may be different. Among the configurations of the V-phase unit 70-V and the W-phase unit 70-W, the same configuration as that of the U-phase unit 70-U will not be described repeatedly.

As illustrated in FIG. 2B, the circuit board 76 is a laminated board sequentially including an insulating plate 81 having an upper surface and a lower surface, a circuit layer 83 provided in the upper surface of the insulating plate 81 and installing the first semiconductor chip 78A and the second semiconductor chip 78B, and a metal layer 85 provided in the lower surface of the insulating plate 81. As illustrated in FIG. 2A, the circuit board 76 has a rectangular shape having two pairs of opposite sides (a pair of sides 76A and 76B and a pair of sides 76C and 76D) in a plan view.

In the specification of the present application, a rectangular shape may mean a quadrangle or an oblong, and at least one corner may have a chamfered shape or a smooth shape. For example, the rectangular shape may include an octagon, a 12 polygon, a 16 polygon, and the like in which each of four corners is chamfered.

The insulating plate 81 may be formed using a ceramic material such as alumina ($Al_2O_3$), aluminum nitride (AlN), or silicon nitride ($Si_3N_4$).

The circuit layer 83 may be a plate material containing a conductive material, and the conductive material may contain any of copper, a copper alloy, aluminum, and an aluminum alloy. The circuit layer 83 is fixed to the upper surface side of the insulating plate 81 by solder, wax, or the like. The semiconductor chip 78 is electrically and mechanically connected, that is, directly connected to the upper surface of the circuit layer 83 by solder or the like in an electric circuit manner.

The circuit layer 83 includes a first mounting portion 91 on which the first semiconductor chip 78A is installed and a second mounting portion 92 on which the second semiconductor chip 78B is installed. The circuit layer 83 of the present embodiment further includes a third mounting portion 93 on which the third semiconductor chip 78C is installed and a fourth mounting portion 94 on which the fourth semiconductor chip 78D is installed. In FIG. 2A, each of the first mounting portion 91 to the fourth mounting portion 94 is indicated by a dot defining a rectangular region. Note that each of the mounting portions is intended to be a region of the circuit layer 83 where the semiconductor chip 78 is installed, and in the present embodiment, each of the mounting portions is a rectangular region merely for the purpose of illustration.

The circuit layer 83 further includes a first upper surface slit 77A and a second upper surface slit 77B provided between the first mounting portion 91 and the second mounting portion 92 and extending in the x axis direction. In a plan view, the first mounting portion 91, the first upper surface slit 77A, the second upper surface slit 77B, and the second mounting portion 92 are provided side by side in the y axis direction. Note that the x axis direction corresponds to the first direction in which the pair of sides 76A and 76B of the rectangular shape described above extends, and the y axis direction corresponds to the second direction in which the other pair of sides 76C and 76D of the rectangular shape extends.

As illustrated in FIG. 2A, the circuit layer 83 of the present embodiment includes a first main circuit pattern 41, a second main circuit pattern 42, and a third main circuit pattern 43 each extending in the x axis direction. In the present embodiment, the first main circuit pattern 41 includes the above-described first mounting portion 91 and third mounting portion 93, and the second main circuit pattern 42 includes the above-described second mounting portion 92 and fourth mounting portion 94. The first main circuit pattern 41 and the second main circuit pattern 42 may not include the third mounting portion 93 and the fourth mounting portion 94, respectively, that is, the third semiconductor chip 78C and the fourth semiconductor chip 78D may not be installed.

In the present embodiment, each of the first main circuit pattern 41, the second main circuit pattern 42, and the third main circuit pattern 43 is adjacent to the other two main circuit patterns. More specifically, the first main circuit pattern 41 is adjacent to both the second main circuit pattern 42 and the third main circuit pattern 43, and the second main circuit pattern 42 is adjacent to both the first main circuit pattern 41 and the third main circuit pattern 43.

In the present embodiment, the first main circuit pattern 41 has a U shape including two longitudinal portions 41A and 41B in a plan view. In the present embodiment, in a plan view, the second main circuit pattern 42 has an I shape, and the third main circuit pattern 43 has an L shape including one longitudinal portion 43A. Further, in the present embodiment, in a plan view, the first main circuit pattern 41, the second main circuit pattern 42, and the third main circuit pattern 43 having such shapes are located so as to form the above-described rectangular shape. The outer shape of the combination of the first main circuit pattern 41, the second main circuit pattern 42, and the third main circuit pattern 43 may be rectangular in a plan view.

As illustrated in FIG. 2A, the circuit layer 83 of the present embodiment further includes a third upper surface slit 77C provided between the first mounting portion 91 and the second mounting portion 92 and extending in the x axis direction. Therefore, in the present embodiment, the first upper surface slit 77A is located between the longitudinal portion 41A of the two longitudinal portions 41A and 41B of the first main circuit pattern 41 and the longitudinal portion 43A of the third main circuit pattern 43. The second upper surface slit 77B is located between the longitudinal portion 41B of the two longitudinal portions 41A and 41B of the first main circuit pattern 41 and the second main circuit pattern 42. The third upper surface slit 77C is located between the longitudinal portion 41B of the two longitudinal portions 41A and 41B of the first main circuit pattern 41 and the longitudinal portion 43A of the third main circuit pattern 43.

As illustrated in FIG. 2A, in the present embodiment, each of the first mounting portion 91 and the third mounting portion 93 is located at both ends of the longitudinal portion 41A of the two longitudinal portions 41A and 41B of the first main circuit pattern 41. The second mounting portion 92 and the fourth mounting portion 94 are respectively located at both ends of the I shape of the second main circuit pattern 42.

As illustrated in FIG. 2A, in the present embodiment, the circuit layer 83 further includes a first control circuit pattern 51, a second control circuit pattern 52, a third control circuit pattern 53, a fourth control circuit pattern 54, three fourth upper surface slits 77I, 77J, and 77K, and three fifth upper surface slits 77L, 77M, and 77N, each of which extends in the y axis direction.

As illustrated in FIG. 2A, among the plurality of configurations of the circuit layer 83 described above, the first mounting portion 91, one fourth upper surface slit 77I, the first control circuit pattern 51, one fourth upper surface slit 77J, the third control circuit pattern 53, one fourth upper surface slit 77K, and the third mounting portion 93 are provided side by side in the x axis direction. The second mounting portion 92, the one fifth upper surface slit 77L, the second control circuit pattern 52, the one fifth upper surface slit 77M, the fourth control circuit pattern 54, the one fifth upper surface slit 77N, and the fourth mounting portion 94 are also provided side by side in the x axis direction.

As illustrated in FIG. 2A, the above-described plurality of upper surface slits of the circuit layer 83 are respectively connected to each other by connection slits. More specifically, one end of the first upper surface slit 77A on the negative side in the x axis is connected to the peripheral edge of the circuit layer 83 by a connection slit 77D extending in the y axis direction, and the other end of the first upper surface slit 77A on the positive side in the x axis is connected to a third upper surface slit 77C by a connection slit 77E extending in the y axis direction. In addition, one end of the second upper surface slit 77B on the positive side in the x axis is connected to the peripheral edge of the circuit layer 83 via an L-shaped connection slit 77H extending in the x axis direction and the y axis direction, and the other end of the second upper surface slit 77B on the negative side in the x axis is connected to the third upper surface slit 77C by a connection slit 77F extending in the y axis direction. In addition, the connection slit 77F is connected to a connection slit 77G extending in the x axis direction from the peripheral edge of the circuit layer 83 in the vicinity of the center in the y axis direction.

One end of each of the fourth upper surface slit 77I, the fourth upper surface slit 77J, and the fourth upper surface slit 77K on the negative side in the y axis is connected to each other by a connection slit 77O extending in the x axis direction. The other end of each of the fourth upper surface slit 77I, the fourth upper surface slit 77J, and the fourth upper surface slit 77K on the positive side in the y axis is connected to the peripheral edge of the circuit layer 83. Similarly, one end of each of the fifth upper surface slit 77L, the fifth upper surface slit 77M, and the fifth upper surface slit 77N on the positive side in the y axis is connected to each other by a connection slit 77P extending in the x axis direction. The other end of each of the fifth upper surface slit 77L, the fifth upper surface slit 77M, and the fifth upper surface slit 77N on the negative side in the y axis is connected to the peripheral edge of the circuit layer 83.

Note that the fourth upper surface slit 77I and the fourth upper surface slit 77K may be examples of two second direction slits extending in the y axis direction of the circuit layer 83. Similarly, the fifth upper surface slit 77L and the fifth upper surface slit 77N may be examples of two second direction slits extending in the y axis direction of the circuit layer 83.

Similarly to the circuit layer 83, the metal layer 85 may be a plate material containing a conductive material, and the conductive material may contain any of copper, a copper alloy, aluminum, and an aluminum alloy. The metal layer 85 includes a first lower surface slit 87A extending in the x axis direction. The metal layer 85 of the present embodiment further includes a second lower surface slit 87B extending in the y axis direction. As illustrated in FIG. 2C, the metal layer 85 of the present embodiment includes a first lower surface pattern 61, a second lower surface pattern 62, a third lower surface pattern 63, and a fourth lower surface pattern 64 each having a rectangular shape in a plan view.

In a plan view, the first lower surface pattern 61, the first lower surface slit 87A, and the second lower surface pattern 62 are provided side by side in the y axis direction. In a plan view, the third lower surface pattern 63, the first lower surface slit 87A, and the fourth lower surface pattern 64 are provided side by side in the y axis direction. In a plan view, the first lower surface pattern 61, the second lower surface slit 87B, and the third lower surface pattern 63 are provided side by side in the x axis direction. In a plan view, the second lower surface pattern 62, the second lower surface slit 87B, and the fourth lower surface pattern 64 are provided side by side in the x axis direction. In the present embodiment, the first lower surface slit 87A and the second lower surface slit 87B may be orthogonal to each other.

In a plan view, the first lower surface slit 87A of the metal layer 85 is located within a range defined by the first upper surface slit 77A and the second upper surface slit 77B of the circuit layer 83. As illustrated in FIG. 2A, FIG. 2B, and FIG. 2C, in the present embodiment, the third upper surface slit 77C of the circuit layer 83 and the first lower surface slit 87A of the metal layer 85 are located at the center in the y-axis direction of the circuit board 76. Therefore, in the present embodiment, as illustrated in FIG. 2A and FIG. 2C, at least a part of the third upper surface slit 77C of the circuit layer 83 and at least a part of the first lower surface slit 87A of the metal layer 85 overlap each other in a plan view.

In the present embodiment, in a plan view, the second lower surface slit 87B of the metal layer 85 is located within the range defined by the three fourth upper surface slits 77I, 77J, and 77K and within the range defined by the three fifth upper surface slits 77L, 77M, and 77N. In the present embodiment, at least a part of the fourth upper surface slit 77J and the fifth upper surface slit 77M of the circuit layer 83 and at least a part of the second lower surface slit 87B of the metal layer 85 overlap each other in a plan view.

In addition, as illustrated in FIG. 2A to FIG. 2C, in the present embodiment, in a plan view, the semiconductor chips 78A, 78B, 78C, and 78D installed on each of the mounting portions 91, 92, 93, and 94 of the circuit layer 83 do not overlap any of the slits 77A to 77P and 87A to 87B included in the circuit layer 83 and the metal layer 85. In this case, the semiconductor apparatus 70 can more efficiently diffuse the heat from each semiconductor chip 78 as compared with the case where the semiconductor chip 78 overlaps any of the slits in a plan view.

Note that the second lower surface slit 87B may be an example of the second direction slit extending in they axis direction of the metal layer 85. In this case, in a plan view, the second direction slit of the metal layer 85 may be located within a range defined by the above-described two second direction slits of the circuit layer 83.

Figure 3A:
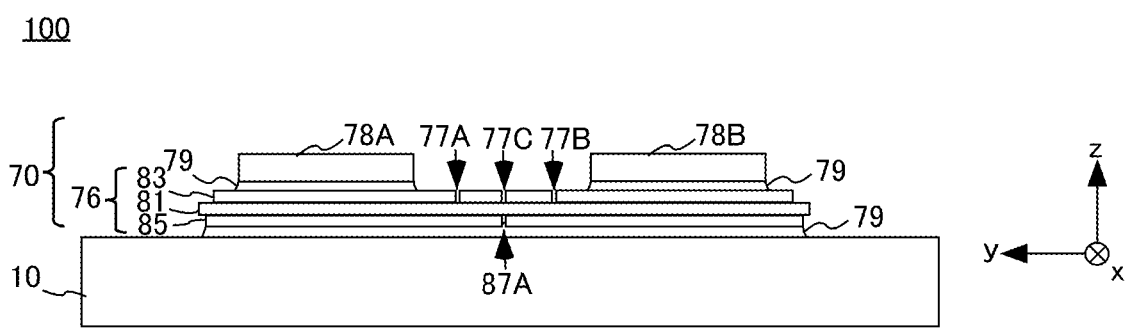
FIG. 3A is a schematic diagram for explaining an example of a state before reflow of the semiconductor module 100 according to an embodiment of the present invention.
Figure 3B:
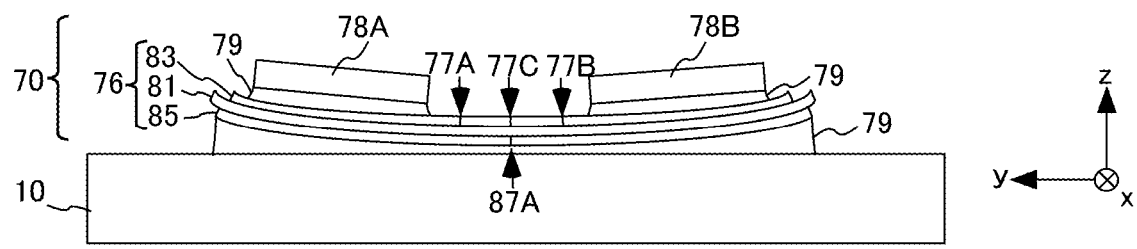
FIG. 3B is a schematic diagram for explaining an example of a state after reflow of the semiconductor module 100 according to an embodiment of the present invention.

FIG. 3A is a schematic diagram for explaining an example of a state before reflow of the semiconductor module 100 according to an embodiment of the present invention. FIG. 3B is a schematic diagram for explaining an example of a state after reflow of the semiconductor module 100 according to an embodiment of the present invention. In the semiconductor module 100 of the present embodiment, the cooling apparatus 10, the circuit board 76, and the semiconductor chip 78 are arranged in this order toward the positive direction in the z axis. The cooling apparatus 10 and the circuit board 76, and the circuit board 76 and the semiconductor chip 78 may be thermally connected. In the present embodiment, the respective members are fixed by the solder 79, and the respective members are thermally connected via the solder 79.

As illustrated in FIG. 3B, the circuit board 76 has a characteristic of being thermally deformed such that the positions of the first mounting portion 91 and the second mounting portion 92 become convex shapes in a direction from the insulating plate 81 toward the metal layer 85 during a heating process of the semiconductor apparatus 70. In the present embodiment, the circuit board 76 of the semiconductor apparatus 70 is installed on the cooling apparatus 10 via the solder 79, and the heating process is, for example, a reflow soldering process. The heating process described above may include, in addition to the process of collectively reflowing the component group including the semiconductor apparatus 70 as in the present embodiment, a process required for assembling the semiconductor apparatus 70 itself, for example, a process of soldering and installing the semiconductor chip 78 on the circuit board 76, a process of soldering and installing the assembled semiconductor apparatus 70 in a convex shape on the cooling apparatus 10, and the like.

In order to dissipate the heat of the semiconductor device with high efficiency, it is conceivable to form the metal foil on the front surface and the back surface of the insulating board thick to increase the heat capacity. In a case where the metal foil is thickened, the influence of thermal expansion of the metal foil increases, and the insulating board is easily deformed during the heating process for installing the semiconductor device on the cooler. Further, in a case where the circuit pattern is formed on the front surface of the insulating board and the circuit pattern is not formed on the back surface of the insulating board, the warpage of the insulating board that undergoes thermal deformation during the heating process is increased, and the fixing agent for fixing the insulating board to the cooling apparatus is easily cracked, so that the installability of the semiconductor device is deteriorated.

Therefore, it is conceivable to reduce the warpage of the insulating board by forming a circuit pattern also on the metal foil on the back surface of the insulating board to balance the warpage force on the front surface side and the warpage force on the back surface side of the insulating board that undergoes thermal deformation. However, the insulating board may be deformed so as to have a convex shape toward the semiconductor device due to the relationship between the slit between the circuit patterns formed on the front surface of the insulating board and the slit between the circuit patterns formed on the back surface of the insulating board.

For example, in a case where the volumes of the metal foils on both surfaces are the same, and the slits are formed at the same position on the front surface and the back surface of the insulating board, the amount of expansion of the metal foil that expands during the heating process is relatively large on the front surface side of the insulating board, so that the insulating board tends to deform into a convex shape toward the semiconductor device.

Further, for example, in a case where the density of the slit formed in the metal foil on the back surface of the insulating board is higher than the density of the slit formed in the metal foil on the front surface of the insulating board in the vicinity of the center of the insulating board, in other words, in a case where the contact area between the front surface of the insulating board and the metal foil is larger than the contact area between the back surface of the insulating board and the metal foil in the vicinity of the center of the insulating board, the insulating board that undergoes thermal deformation extends in the plane direction more greatly on the front surface side than on the back surface side, whereby the insulating board tends to deform into a convex shape toward the semiconductor device.

As described above, when the insulating board is thermally deformed so as to have a convex shape toward the semiconductor device during the heating process for installing the semiconductor device on the cooler, the thickness of the fixing agent for fixing the insulating board to the cooler becomes thin on the peripheral edge side of the insulating board, and a crack is likely to occur particularly on the peripheral edge side of the fixing agent, so that installability of the semiconductor device is deteriorated.

On the other hand, according to the semiconductor apparatus 70 of the present embodiment, in a plan view, the circuit layer 83 of the circuit board 76 includes the first upper surface slit 77A and the second upper surface slit 77B extending in the direction (x axis direction) in which the pair of sides of the rectangular circuit board 76 extends. According to the semiconductor apparatus 70, further, the first mounting portion 91 on which the first semiconductor chip 78A is installed, the first upper surface slit 77A, the second upper surface slit 77B, and the second mounting portion 92 on which the second semiconductor chip 78B is installed are provided side by side in a direction (y axis direction) in which the other pair of sides of the rectangular circuit board 76 extends. According to the semiconductor apparatus 70, further, in a plan view, the metal layer 85 of the circuit board 76 includes the first lower surface slit 87A located within the range defined by the first upper surface slit 77A and the second upper surface slit 77B of the circuit layer 83.

As illustrated in FIG. 3B, the circuit board 76 of the semiconductor apparatus 70 of the present embodiment having the above configuration deforms in the virtual cross section on the yz plane such that the positions of the four mounting portions become convex shapes in the direction from the insulating plate 81 toward the metal layer 85 in a post-reflow state for installing the semiconductor apparatus 70 on the cooling apparatus 10, in other words, so as to be concave toward each semiconductor chip 78. As a result, in the semiconductor apparatus 70 according to the present embodiment, the thickness of the solder 79 for fixing the circuit board 76 to the cooling apparatus 10 increases in the vicinity of both ends in the y axis direction of the circuit board 76 when the circuit board 76 is thermally deformed by reflow, and thus it is possible to make it difficult for cracks to occur particularly in the vicinity of both ends in the y axis direction of the solder 79. Therefore, according to the semiconductor apparatus 70 of the present embodiment, as compared with a semiconductor apparatus having a tendency of being thermally deformed such that the insulating board becomes a convex shape toward the semiconductor device, it is possible to suppress deterioration in installability of the semiconductor apparatus 70, and as a result, it is possible to enhance heat dissipation without reducing the non-defective product rate of the semiconductor apparatus 70.

Further, according to the semiconductor apparatus 70 of the present embodiment, in a plan view, the circuit layer 83 of the circuit board 76 includes the three fourth upper surface slits 77I, 77J, and 77K and the three fifth upper surface slits 77L, 77M, and 77N extending in the direction (y axis direction) in which the pair of sides of the rectangular circuit board 76 extends. According to the semiconductor apparatus 70, further, the first mounting portion 91 on which the first semiconductor chip 78A is installed, the three fourth upper surface slits 77I, 77J, and 77K, and the third mounting portion 93 on which the third semiconductor chip 78C is installed are provided side by side in a direction (x axis direction) in which the other pair of sides of the rectangular circuit board 76 extends. According to the semiconductor apparatus 70, further, the second mounting portion 92 on which the second semiconductor chip 78B is installed, the three fifth upper surface slits 77L, 77M, and 77N, and the fourth mounting portion 94 on which the fourth semiconductor chip 78D is installed are provided side by side in a direction (x axis direction) in which the other pair of sides of the rectangular circuit board 76 extends.

Further, according to the semiconductor apparatus 70 of the present embodiment, in a plan view, the second lower surface slit 87B of the metal layer 85 is located within the range defined by the three fourth upper surface slits 77I, 77J, and 77K and within the range defined by the three fifth upper surface slits 77L, 77M, and 77N. With these configurations, the semiconductor apparatus 70 is deformed such that the positions of the four mounting portions become convex shapes in the direction from the insulating plate 81 toward the metal layer 85, in other words, concave toward each semiconductor chip 78 in the post-reflow state in the virtual cross section on the xz plane. In the semiconductor apparatus 70, the above-described deformation mode of the virtual cross section on the yz plane and the deformation mode of the virtual cross section on the xz plane are combined, and after the reflow, the circuit board 76 is deformed into a bowl shape from the insulating plate 81 toward the metal layer 85.

Therefore, according to the semiconductor apparatus 70 of the present embodiment, when the circuit board 76 is thermally deformed by reflow for installing on the cooling apparatus 10, the thickness of the solder 79 for fixing the circuit board 76 to the cooling apparatus 10 increases on the peripheral edge side of the circuit board 76, so that it is possible to suppress the occurrence of a crack in the solder 79 over the entire circumference of the circuit board 76.

In the embodiments described above, the circuit layer 83 and the metal layer 85 may be formed of the same material. Further, the circuit layer 83 and the metal layer 85 may have the same thickness with each other. Some or all of the plurality of upper surface slits, the plurality of connection slits, and the plurality of lower surface slits included in the circuit layer 83 and the metal layer 85 may have the same width with each other. Each of these configurations also contributes to enhancing the identity between the circuit layer 83 and the metal layer 85 except for the slit formation position of each of the circuit layer 83 and the metal layer 85, thereby further reducing the amount of warpage of the circuit board 76 after reflow.

In the above embodiment, as illustrated in FIG. 2A, the plurality of upper surface slits and connection slits of the circuit layer 83 and the plurality of lower surface slits of the metal layer 85 have been described as linear slits. Alternatively, any one or more of the plurality of slits may be a curved slit.

Further, in the above embodiment, as illustrated in FIG. 2B, FIG. 3A and FIG. 3B, the plurality of upper surface slits and connection slits of the circuit layer 83 and the plurality of lower surface slits of the metal layer 85 have been illustrated as slits penetrating each of the circuit layer 83 and the metal layer 85, that is, slits exposing the insulating plate 81. However, instead of this, any one or more slits of the plurality slits may be a concave slit not penetrating each layer, that is, slits not exposing the insulating plate 81.

As an example in the above embodiment, the slit widths of some or all of the plurality of upper surface slits, the plurality of connection slits, and the plurality of lower surface slits included in the circuit layer 83 and the metal layer 85 may range from 0.5 to 2.0 times the thicknesses of the circuit layer 83 and the metal layer 85. Further, as an example, the slit depths of some or all of the plurality of upper surface slits, the plurality of connection slits, and the plurality of lower surface slits included in the circuit layer 83 and the metal layer 85 may be 0.25 times or more the thickness of the circuit layer 83 and the metal layer 85. In addition, as an example, the thicknesses of the circuit layer 83 and the metal layer 85 may range from 0.2 to 2.0 mm.

Figure 4:
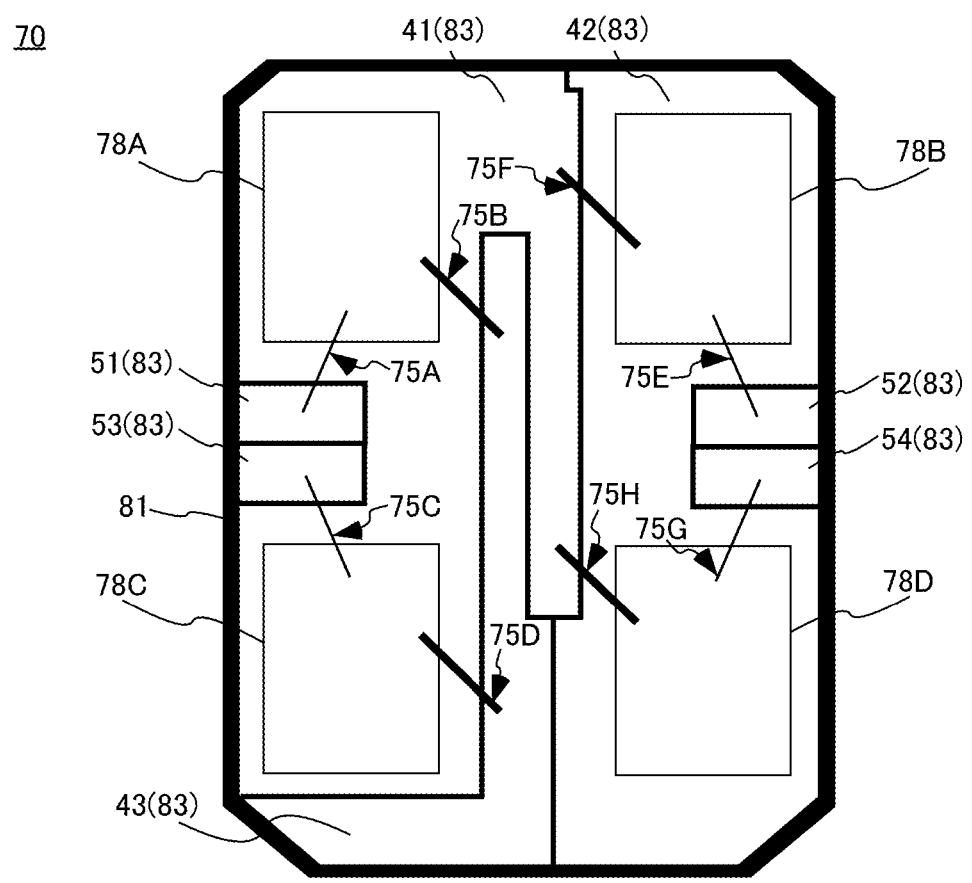
FIG. 4 is a plan view illustrating an example of a semiconductor apparatus 70 of the semiconductor module 100 according to an embodiment of the present invention.
Figure 4:
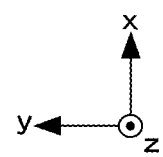

FIG. 4 is a plan view illustrating an example of the semiconductor apparatus 70 of the semiconductor module 100 according to an embodiment of the present invention. As illustrated in FIG. 4, the circuit layer 83 may be electrically connected to the semiconductor chip 78 or another conductive member by wiring.

As illustrated in FIG. 4, in the present embodiment, the semiconductor apparatus 70 further includes a control wiring 75A that connects the first semiconductor chip 78A and the first control circuit pattern 51, a main circuit wiring 75B that connects the first semiconductor chip 78A and the third main circuit pattern 43, and a control wiring 75C that connects the third semiconductor chip 78C and the third control circuit pattern 53. In the present embodiment, the semiconductor apparatus 70 further includes a main circuit wiring 75D that connects the third semiconductor chip 78C and the third main circuit pattern 43, a control wiring 75E that connects the second semiconductor chip 78B and the second control circuit pattern 52, a main circuit wiring 75F that connects the second semiconductor chip 78B and the first main circuit pattern 41, a control wiring 75G that connects the fourth semiconductor chip 78D and the fourth control circuit pattern 54, and a main circuit wiring 75H that connects the fourth semiconductor chip 78D and the first main circuit pattern 41.

As illustrated in FIG. 4, in the present embodiment, the same cross-sectional area and length of each of the plurality of control wirings 75A, 75C, 75E, and 75G are equal to each other, and the same cross-sectional area and length of each of the plurality of main circuit wirings 75B, 75D, 75F, and 75H are equal to each other. As a result, in the semiconductor apparatus 70, the inductances of the plurality of control wirings 75A, 75C, 75E, and 75G can be made equal to each other, and similarly, the inductances of the plurality of main circuit wirings 75B, 75D, 75F, and 75H can be made equal to each other. Each of the plurality of wirings 75A to 75H may be a conductor, for example, a conductive wire, a ribbon, a clip, or the like.

Figure 5A:
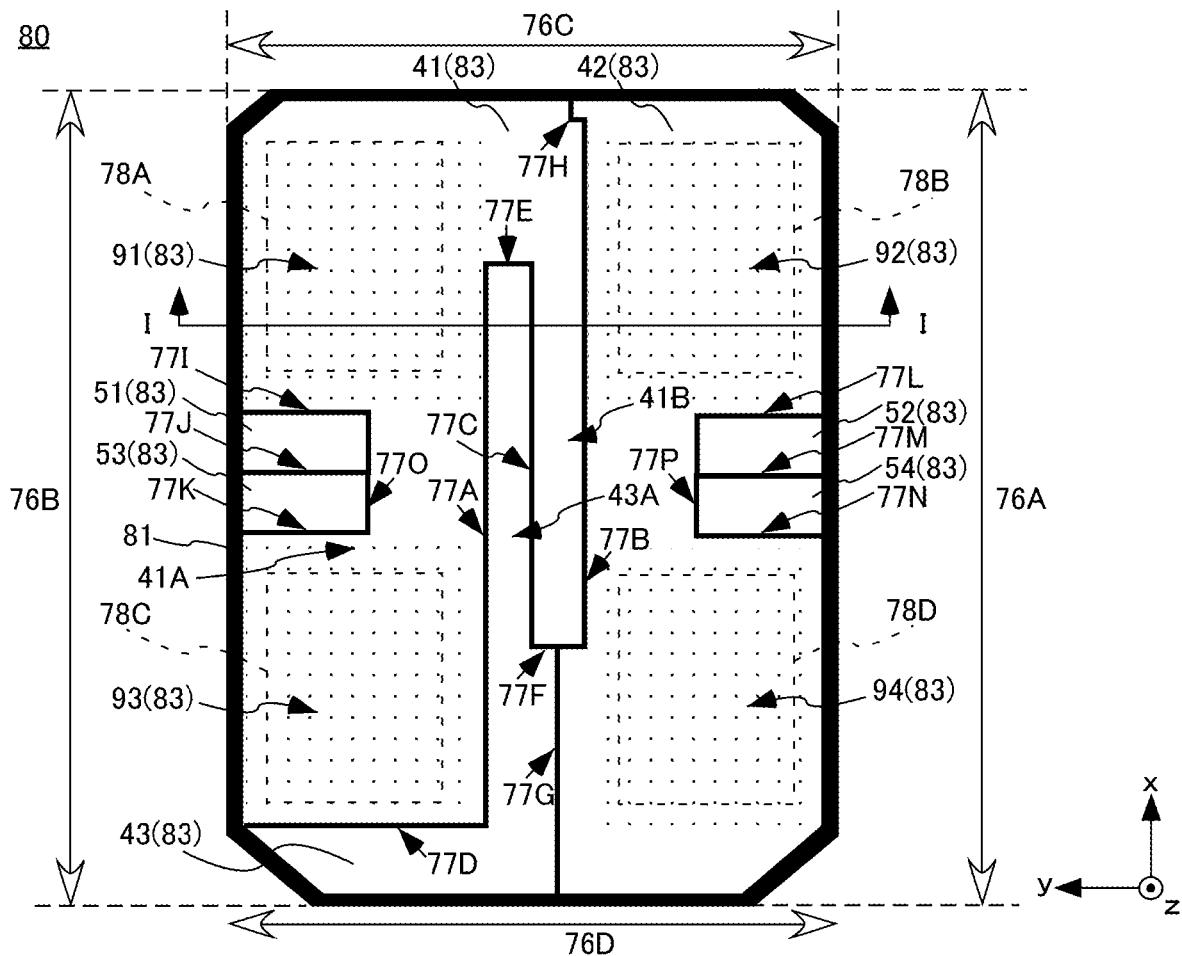
FIG. 5A is a plan view illustrating an example of a circuit board 80 of the semiconductor module 100 according to an embodiment of the present invention.
Figure 5B:
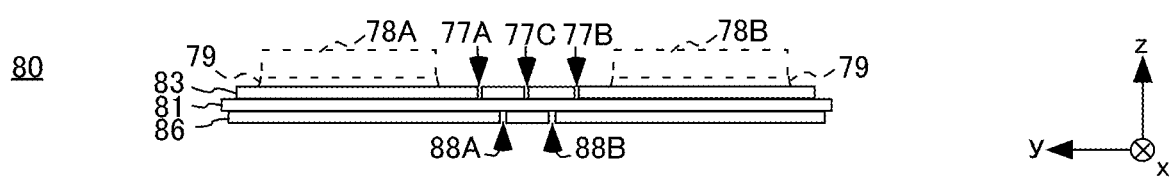
FIG. 5B is a sectional view illustrating an example of a circuit board 80 of the semiconductor module 100 according to an embodiment of the present invention.
Figure 5C:
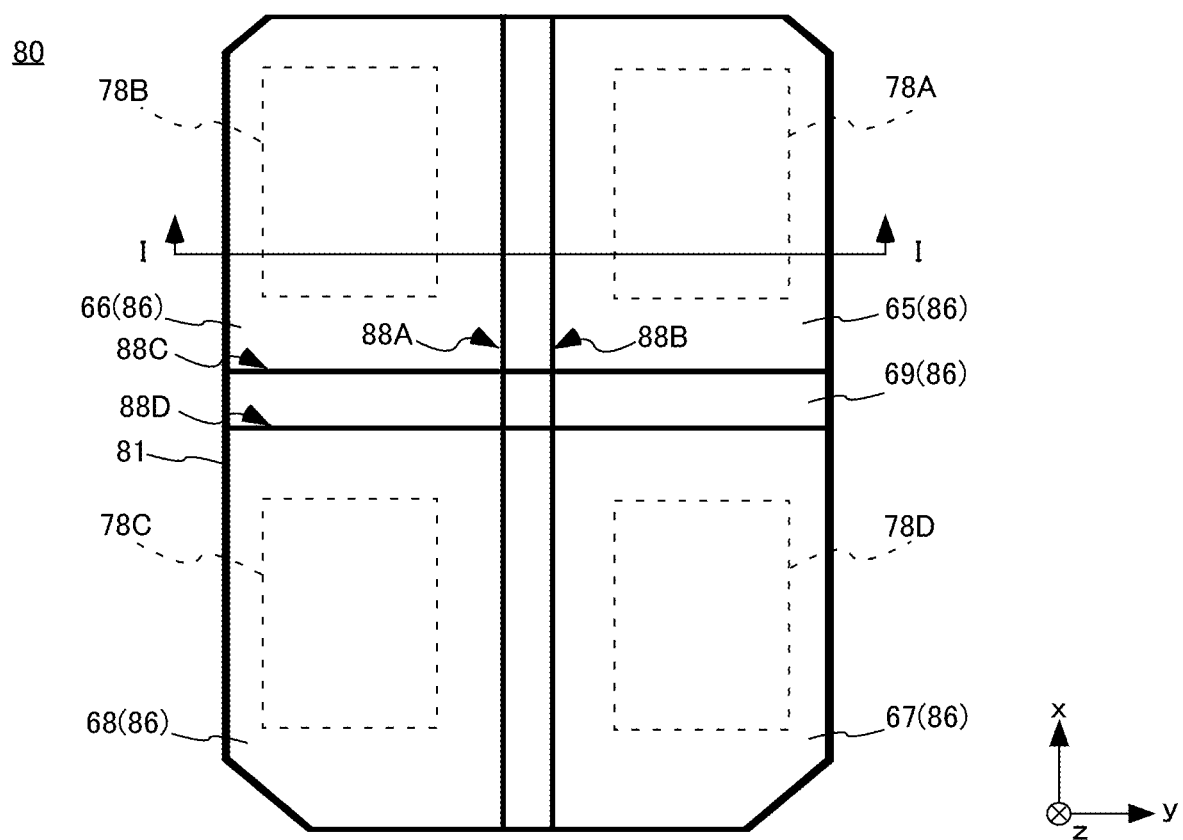
FIG. 5C is a bottom view illustrating an example of a circuit board 80 of the semiconductor module 100 according to an embodiment of the present invention.

FIG. 5A is a plan view illustrating an example of the circuit board 80 of the semiconductor module 100 according to an embodiment of the present invention. FIG. 5B is a sectional view illustrating an example of the circuit board 80 of the semiconductor module 100 according to an embodiment of the present invention. FIG. 5C is a bottom view illustrating an example of the circuit board 80 of the semiconductor module 100 according to an embodiment of the present invention. The semiconductor apparatus 70 of the semiconductor module 100 according to the present embodiment includes the circuit board 80 instead of the circuit board 76 described with reference to FIG. 1 to FIG. 4.

The circuit board 80 has the same configuration as the circuit board 76 except that a metal layer 86 is included instead of the metal layer 85 included in the circuit board 76. In the configuration of the circuit board 80, the same configuration as that of the circuit board 76 is denoted by a corresponding reference numeral, and redundant description is omitted.

The metal layer 86 includes two first lower surface slits 88A and 88B extending in the x axis direction. The metal layer 85 of the present embodiment further includes two second lower surface slits 88C and 88D extending in the y axis direction. As illustrated in FIG. 5C, the metal layer 86 of the present embodiment includes a first lower surface pattern 65, a second lower surface pattern 66, a third lower surface pattern 67, and a fourth lower surface pattern 68 each having a rectangular shape in a plan view, and a fifth lower surface pattern 69 located between these lower surface patterns and having a cross shape as a whole. The fifth lower surface pattern 69 is divided into five regions by the two first lower surface slits 88A and 88B and the two second lower surface slits 88C and 88D.

In a plan view, the first lower surface pattern 65, the first lower surface slit 88B, a part of the fifth lower surface pattern 69, the first lower surface slit 88A, and the second lower surface pattern 66 are provided side by side in the y axis direction. In a plan view, the third lower surface pattern 67, the first lower surface slit 88B, a part of the fifth lower surface pattern 69, the first lower surface slit 88A, and the fourth lower surface pattern 68 are provided side by side in the y axis direction. In a plan view, the first lower surface pattern 65, the second lower surface slit 88C, a part of the fifth lower surface pattern 69, the second lower surface slit 88D, and the third lower surface pattern 67 are provided side by side in the x axis direction. In a plan view, the second lower surface pattern 66, the second lower surface slit 88C, a part of the fifth lower surface pattern 69, the second lower surface slit 88D, and the fourth lower surface pattern 68 are provided side by side in the x axis direction. In the present embodiment, the first lower surface slits 88A and 88B and the second lower surface slits 88C and 88D may each be orthogonal to each other.

In a plan view, the first lower surface slits 88A and 88B of the metal layer 86 is located within a range defined by the first upper surface slit 77A and the second upper surface slit 77B of the circuit layer 83. As illustrated in FIG. 5A, FIG. 5B, and FIG. 5C, in the present embodiment, the third upper surface slit 77C of the circuit layer 83 is located at the center of the circuit board 80 in the y axis direction. In addition, in the present embodiment, the first lower surface slit 88A is located between the first upper surface slit 77A and the third upper surface slit 77C of the circuit layer 83 in a plan view. In addition, in the present embodiment, the first lower surface slit 88B is located between the second upper surface slit 77B and the third upper surface slit 77C of the circuit layer 83 in a plan view.

In the present embodiment, in a plan view, the second lower surface slits 88C and 88D of the metal layer 85 are located within the range defined by the three fourth upper surface slits 77I, 77J, and 77K and within the range defined by the three fifth upper surface slits 77L, 77M, and 77N. In the present embodiment, in a plan view, the second lower surface slit 88C of the metal layer 85 is located between the fourth upper surface slit 77I and the fourth upper surface slit 77J and between the fifth upper surface slit 77L and the fifth upper surface slit 77M. In the present embodiment, in a plan view, the second lower surface slit 88D of the metal layer 85 is located between the fourth upper surface slit 77J and the fourth upper surface slit 77K and between the fifth upper surface slit 77M and the fifth upper surface slit 77N.

The second lower surface slits 88C and 88D may be an example of the second direction slit extending in the y axis direction of the metal layer 86. In this case, in a plan view, the second direction slit of the metal layer 86 may be located within a range defined by the above-described two second direction slits of the circuit layer 83.

As described above, according to the semiconductor apparatus 70 including the circuit board 80 illustrated in FIG. 5A to FIG. 5C, unlike the circuit board 76 illustrated in FIG. 1 to FIG. 4, the metal layer 86 includes the plurality of lower surface slits extending in each of the x axis direction and the y axis direction. Further, according to the semiconductor apparatus 70 including the circuit board 80, each of the first lower surface slits 88A and 88B and the second lower surface slits 88C and 88D of the metal layer 86 is shifted from the center line of the circuit board 80 in each of the y axis direction and the x axis direction. The semiconductor apparatus 70 including the circuit board 80 having such a configuration also achieves effects similar to those of the semiconductor apparatus 70 including the circuit board 76 illustrated in FIG. 1 to FIG. 4.

Figure 6:
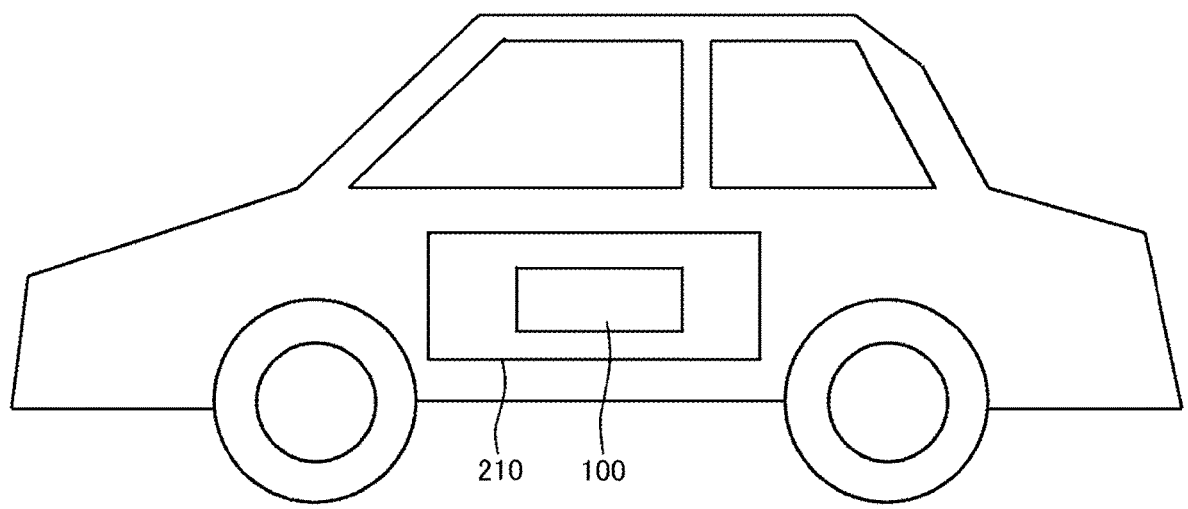
FIG. 6 is a diagram illustrating an outline of a vehicle 200 according to an embodiment of the present invention.

FIG. 6 is a diagram illustrating an outline of a vehicle 200 according to an embodiment of the present invention. The vehicle 200 is a vehicle that generates at least some propulsion power using electric power. As an example, the vehicle 200 is an electric vehicle that generates all propulsion power by an electric power drive device such as a motor, or a hybrid vehicle that uses both an electric power drive device such as a motor and an internal combustion engine driven by fuel such as gasoline.

The vehicle 200 includes the semiconductor apparatus 70. More specifically, the vehicle 200 includes a control apparatus 210 (external apparatus) that controls an electric power drive mechanism such as a motor, and the control apparatus 210 is provided with the semiconductor module 100 including the semiconductor apparatus 70. The semiconductor module 100 may control power to be supplied to the electric power driving device.

Figure 7:
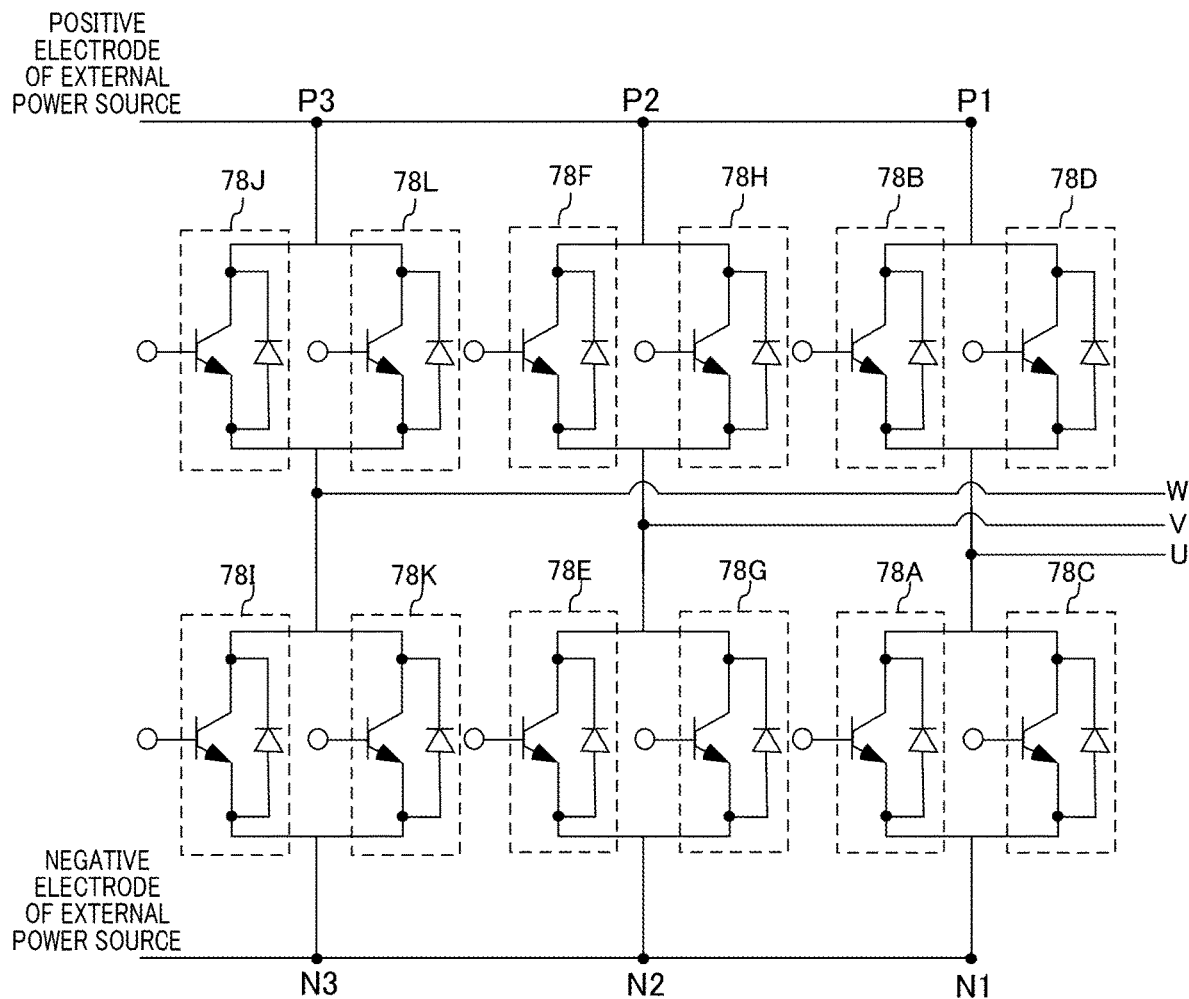
FIG. 7 is a main circuit diagram of the semiconductor module 100 according to an embodiment of the present invention.

FIG. 7 is a main circuit diagram of the semiconductor module 100 according to a plurality of embodiments of the present invention. The semiconductor module 100 functions as a three-phase AC inverter circuit having output terminals U, V, and W, and may be a part of an in-vehicle unit that drives a motor of a vehicle.

In the semiconductor module 100, the second semiconductor chips 78B, 78F, and 78J and the fourth semiconductor chips 78D, 78H, and 78L may constitute an upper arm, and the first semiconductor chips 78A, 78E, and 78I and the third semiconductor chips 78C, 78 G, and 78K may constitute a lower arm.

A combination of at least any of the first semiconductor chip 78A and the third semiconductor chip 78C and at least any of the second semiconductor chip 78B and the fourth semiconductor chip 78D may constitute a leg (U phase). A combination of at least any of the first semiconductor chip 78E and the third semiconductor chip 78G and at least any of the second semiconductor chip 78F and the fourth semiconductor chip 78H may also constitute a leg (V phase). A combination of at least any of the first semiconductor chip 78I and the third semiconductor chip 78K and at least any of the second semiconductor chip 78J and the fourth semiconductor chip 78L may also constitute a leg (W phase).

In at least any of the first semiconductor chip 78A and the third semiconductor chip 78C, the emitter electrode may be electrically connected to an input terminal N1, and the collector electrode may be electrically connected to an output terminal U, respectively. In at least any of the second semiconductor chip 78B and the fourth semiconductor chip 78D, the emitter electrode may be electrically connected to the output terminal U, and the collector electrode may be electrically connected to an input terminal P1, respectively.

Similarly, in at least any of the first semiconductor chip 78E and the third semiconductor chip 78G and at least any of the first semiconductor chip 78I and the third semiconductor chip 78K, the emitter electrode may be electrically connected to input terminals N2 and N3, respectively, and the collector electrode may be electrically connected to output terminals V and W, respectively. Further, in at least any of the second semiconductor chip 78F and the fourth semiconductor chip 78H and at least any of the second semiconductor chip 78J and the fourth semiconductor chip 78L, the emitter electrode may be electrically connected to the output terminals V and W, respectively, and the collector electrode may be electrically connected to input terminals P2 and P3, respectively.

Each semiconductor chip 78 may be alternately switched by a signal input to the corresponding control terminal. In the present embodiment, each semiconductor chip 78 may generate heat during switching. The input terminals P1, P2, and P3 may be connected to the positive electrode of the external power source, the input terminals N1, N2, and N3 may be connected to the negative electrode of the external power supply, and the output terminals U, V, and W may be connected to the load, respectively. The input terminals P1, P2, and P3 may be electrically connected to each other, and the other input terminals N1, N2, and N3 may also be electrically connected to each other.

In the semiconductor module 100, each semiconductor chip 78 may be an RC-IGBT (reverse conducting IGBT) semiconductor chip. In addition, each semiconductor chip 78 may include a combination of a transistor such as a MOSFET or an IGBT and a diode.

In the above description of the plurality of embodiments, there is a case where a specific state is expressed by using the word "substantially" together, for example, "substantially the same", "substantially matched", "substantially constant", "substantially symmetrical", "substantially rhombic", and the like. However, all of these are intended to include not only a state that is strictly the specific state but also a state that is generally the specific state.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, in the above embodiment, it has been described that the semiconductor module 100 includes three semiconductor apparatuses 70, but instead of this, one, two, or four or more semiconductor apparatuses 70 may be included.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: cooling apparatus
41: first main circuit pattern
41A, 41B: longitudinal portion
42: second main circuit pattern
43: third main circuit pattern
43A: longitudinal portion
51: first control circuit pattern
52: second control circuit pattern 53: third control circuit pattern
54: fourth control circuit pattern
61, 65: first lower surface pattern
62, 66: second lower surface pattern
63, 67: third lower surface pattern
64, 68: fourth lower surface pattern
69: fifth lower surface pattern
70: semiconductor apparatus
70-U: U-phase unit
70-V: V-phase unit
70-W: W-phase unit
75A, 75B, 75C, 75D, 75E, 75F, 75G, and 75H: wiring
76, 80: circuit board
76A, 76B, 76C, 76D: side
77A: first upper surface slit
77B: second upper surface slit
77C: third upper surface slit
77D, 77E, 77F, 77G, 77H, 77O, 77P: connecting slit
77I, 77J, 77K: fourth upper surface slit
77L, 77M, 77N: fifth upper surface slit
78: semiconductor chip
78A, 78E, 78I: first semiconductor chip
78B, 78F, 78J: second semiconductor chip
78C, 78 G, 78 K: third semiconductor chip
78D, 78H, 78 L: fourth semiconductor chip
79: solder
81: insulating plate
83: circuit layer
85, 86: metal layer
87A: first lower surface slit
87B: second lower surface slit
88A, 88B: first lower surface slit
88C, 88D: second lower surface slit
91: first mounting portion
92: second mounting portion
93: third mounting portion
94: fourth mounting portion
100: semiconductor module
200: vehicle
210: control apparatus

What is claimed is:

1. A semiconductor apparatus comprising:
a first semiconductor chip and a second semiconductor chip; and
a circuit board,
wherein the circuit board is a laminated board including, in order, an insulating plate having an upper surface and a lower surface, a circuit layer provided in the upper surface and on which the first semiconductor chip and the second semiconductor chip are installed, and a metal layer provided in the lower surface, the circuit board having a rectangular shape in a plan view having two pairs of opposite sides,
wherein the circuit layer includes a first mounting portion on which the first semiconductor chip is installed, a second mounting portion on which the second semiconductor chip is installed, and a first upper surface slit and a second upper surface slit provided between the first mounting portion and the second mounting portion and extending in a first direction in which a pair of sides of the rectangular shape extends,
wherein the metal layer includes a first lower surface slit extending in the first direction,
wherein, in a plan view, the first mounting portion, the first upper surface slit, the second upper surface slit, and the second mounting portion are provided side by side in a second direction in which the other pair of sides of the rectangular shape extends, and the first lower surface slit is located within a range defined by the first upper surface slit and the second upper surface slit, and
wherein the circuit board has a characteristic of being thermally deformed such that positions of the first mounting portion and the second mounting portion become convex shapes in a direction from the insulating plate toward the metal layer during a heating process of the semiconductor apparatus.

2. The semiconductor apparatus according to claim 1,
wherein the circuit layer includes a first main circuit pattern, a second main circuit pattern, and a third main circuit pattern each extending in the first direction,
wherein the first main circuit pattern includes the first mounting portion, and the second main circuit pattern includes the second mounting portion, and
wherein the first main circuit pattern, the second main circuit pattern, and the third main circuit pattern are each adjacent to the other two main circuit patterns.

3. The semiconductor apparatus according to claim 2,
wherein, in a plan view, the first main circuit pattern has a U shape including two longitudinal portions, the second main circuit pattern has an I shape, the third main circuit pattern has an L shape including one longitudinal portion, and the first main circuit pattern, the second main circuit pattern, and the third main circuit pattern are located so as to form the rectangular shape.

4. The semiconductor apparatus according to claim 3,
wherein the circuit layer further includes a third upper surface slit provided between the first mounting portion and the second mounting portion and extending in the first direction, and
wherein the first upper surface slit is located between one of the two longitudinal portions of the first main circuit pattern and the longitudinal portion of the third main circuit pattern, the second upper surface slit is located between the other one of the two longitudinal portions of the first main circuit pattern and the second main circuit pattern, and the third upper surface slit is located between the other one of the two longitudinal portions of the first main circuit pattern and the longitudinal portion of the third main circuit pattern.

5. The semiconductor apparatus according to claim 3, further comprising:
a third semiconductor chip and a fourth semiconductor chip,
wherein the first main circuit pattern further includes a third mounting portion on which the third semiconductor chip is installed,
wherein the second main circuit pattern further includes a fourth mounting portion on which the fourth semiconductor chip is installed,
wherein each of the first mounting portion and the third mounting portion is located at both ends of one of the two longitudinal portions of the first main circuit pattern, and
wherein each of the second mounting portion and the fourth mounting portion is located at both ends of the I shape of the second main circuit pattern.

6. The semiconductor apparatus according to claim 4, further comprising:
a third semiconductor chip and a fourth semiconductor chip, wherein the first main circuit pattern further includes a third mounting portion on which the third semiconductor chip is installed, wherein the second main circuit pattern further includes a fourth mounting portion on which the fourth semiconductor chip is installed, wherein each of the first mounting portion and the third mounting portion is located at both ends of one of the two longitudinal portions of the first main circuit pattern, and wherein each of the second mounting portion and the fourth mounting portion is located at both ends of the I shape of the second main circuit pattern.

7. The semiconductor apparatus according to claim 5, wherein the circuit layer further includes a first control circuit pattern, a second control circuit pattern, a third control circuit pattern, a fourth control circuit pattern, three fourth upper surface slits, and three fifth upper surface slits, each of which extends in the second direction, wherein the first mounting portion, one of the fourth upper surface slits, the first control circuit pattern, another one of the fourth upper surface slits, the third control circuit pattern, the other one of the fourth upper surface slits, and the third mounting portion are provided side by side in the first direction, wherein the second mounting portion, one of the fifth upper surface slits, the second control circuit pattern, another one of the fifth upper surface slits, the fourth control circuit pattern, the other one of the fifth upper surface slits, and the fourth mounting portion are provided side by side in the first direction, wherein the metal layer further includes a second lower surface slit extending in the second direction, and wherein, in a plan view, the second lower surface slit is located within a range defined by the three fourth upper surface slits and within a range defined by the three fifth upper surface slits.

8. The semiconductor apparatus according to claim 6, wherein the circuit layer further includes a first control circuit pattern, a second control circuit pattern, a third control circuit pattern, a fourth control circuit pattern, three fourth upper surface slits, and three fifth upper surface slits, each of which extends in the second direction, wherein the first mounting portion, one of the fourth upper surface slits, the first control circuit pattern, another one of the fourth upper surface slits, the third control circuit pattern, the other one of the fourth upper surface slits, and the third mounting portion are provided side by side in the first direction, wherein the second mounting portion, one of the fifth upper surface slits, the second control circuit pattern, another one of the fifth upper surface slits, the fourth control circuit pattern, the other one of the fifth upper surface slits, and the fourth mounting portion are provided side by side in the first direction, wherein the metal layer further includes a second lower surface slit extending in the second direction, and wherein, in a plan view, the second lower surface slit is located within a range defined by the three fourth upper surface slits and within a range defined by the three fifth upper surface slits.

9. The semiconductor apparatus according to claim 7, further comprising:

a control wiring configured to connect the first semiconductor chip and the first control circuit pattern, a control wiring configured to connect the third semiconductor chip and the third control circuit pattern, a control wiring configured to connect the second semiconductor chip and the second control circuit pattern, and a control wiring configured to connect the fourth semiconductor chip and the fourth control circuit pattern, wherein cross-sectional areas and lengths of a plurality of the control wirings are equal to each other.

10. The semiconductor apparatus according to claim 8, further comprising:

a control wiring configured to connect the first semiconductor chip and the first control circuit pattern, a control wiring configured to connect the third semiconductor chip and the third control circuit pattern, a control wiring configured to connect the second semiconductor chip and the second control circuit pattern, and a control wiring configured to connect the fourth semiconductor chip and the fourth control circuit pattern, wherein cross-sectional areas and lengths of a plurality of the control wirings are equal to each other.

11. The semiconductor apparatus according to claim 7, further comprising:

a main circuit wiring configured to connect the first semiconductor chip and the third main circuit pattern, a main circuit wiring configured to connect the third semiconductor chip and the third main circuit pattern, a main circuit wiring configured to connect the second semiconductor chip and the first main circuit pattern, and a main circuit wiring configured to connect the fourth semiconductor chip and the first main circuit pattern, wherein cross-sectional areas and lengths of a plurality of the main circuit wirings are equal to each other.

12. The semiconductor apparatus according to claim 8, further comprising:

a main circuit wiring configured to connect the first semiconductor chip and the third main circuit pattern, a main circuit wiring configured to connect the third semiconductor chip and the third main circuit pattern, a main circuit wiring configured to connect the second semiconductor chip and the first main circuit pattern, and a main circuit wiring configured to connect the fourth semiconductor chip and the first main circuit pattern, wherein cross-sectional areas and lengths of a plurality of the main circuit wirings are equal to each other.

13. The semiconductor apparatus according to claim 9, further comprising:

a main circuit wiring configured to connect the first semiconductor chip and the third main circuit pattern, a main circuit wiring configured to connect the third semiconductor chip and the third main circuit pattern, a main circuit wiring configured to connect the second semiconductor chip and the first main circuit pattern, and a main circuit wiring configured to connect the fourth semiconductor chip and the first main circuit pattern, wherein cross-sectional areas and lengths of a plurality of the main circuit wirings are equal to each other.

14. The semiconductor apparatus according to claim 1, wherein the circuit layer includes two second direction slits extending in the second direction, wherein the metal layer includes a second direction slit extending in the second direction, and wherein, in a plan view, the second direction slit of the metal layer is located within a range defined by the two second direction slits of the circuit layer.

15. The semiconductor apparatus according to claim 1, wherein, in a plan view, a semiconductor chip installed on each of the mounting portions does not overlap any slit included in the circuit layer and the metal layer.

16. The semiconductor apparatus according to claim 1, wherein the circuit layer and the metal layer are formed of a same material.

17. The semiconductor apparatus according to claim 16, wherein the material includes any of copper, a copper alloy, aluminum, and an aluminum alloy.

18. The semiconductor apparatus according to claim 1, wherein the circuit layer and the metal layer have a same thickness with each other.

19. The semiconductor apparatus according to claim 1, wherein any slit included in the circuit layer and the metal layer have a same width with each other.

20. A vehicle, comprising:
the semiconductor apparatus according to claim 1.

* * * * *